(12) United States Patent
Grill et al.

(10) Patent No.: US 7,851,288 B2
(45) Date of Patent: Dec. 14, 2010

(54) FIELD EFFECT TRANSISTOR USING CARBON BASED STRESS LINER

(75) Inventors: Alfred Grill, White Plains, NY (US); Son Nguyen, Yorktown Heights, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 11/760,030

(22) Filed: Jun. 8, 2007

(65) Prior Publication Data

US 2008/0303068 A1    Dec. 11, 2008

(51) Int. Cl.
*H01L 21/8238* (2006.01)

(52) U.S. Cl. .............................. 438/199; 257/E51.038; 257/E21.041; 257/E21.27

(58) Field of Classification Search ......... 257/787–788, 257/790, 678, 701–702, 707, E51.038, E21.041, 257/E21.27; 438/199
See application file for complete search history.

(56) References Cited

U.S. PATENT DOCUMENTS

| | | | |
|---|---|---|---|
| 6,342,733 B1 * | 1/2002 | Hu et al. ..................... | 257/750 |
| 7,030,468 B2 | 4/2006 | Gates et al. | |
| 7,507,300 B2 * | 3/2009 | Boykin et al. ................. | 134/26 |
| 7,615,434 B2 * | 11/2009 | Sun et al. ..................... | 438/199 |
| 2003/0190476 A1 * | 10/2003 | Veerasamy et al. .......... | 428/408 |
| 2004/0061118 A1 * | 4/2004 | Yamazaki et al. ............ | 257/79 |
| 2005/0186722 A1 | 8/2005 | Cheng et al. | |
| 2005/0285187 A1 | 12/2005 | Bryant et al. | |
| 2007/0132375 A1 * | 6/2007 | Bachmann et al. .......... | 313/505 |
| 2007/0200179 A1 * | 8/2007 | Chen .......................... | 257/369 |

OTHER PUBLICATIONS

Thompson et al., in "Future of Strained Si/Semiconductors in Nanoscale MOSFETS," IEDM 2006, Paper 27.1.
Fallon et al., in "Properties of filtered-ion-beam-deposited diamond-like carbon as a function of ion energy," Phys. Rev. B, 48, 4777 (1993).
Ha et al., in "Intrinsic stress of DLC film prepared by RF plasma CVD and filtered cathodic arc PVD," IEEE International Conference on Plasma Science, Paper 6D7, Jun. 2005, Monterey, CA.
Grill, in "Plasma-deposited diamond-like carbon and related materials," IBM J. Res. Devel., 43, 147 (1999).
Fulton, et al. in "New Ion-assisted Filtered Cathodic Arc Deposition (IFCAD) technology for producing advanced thin-films on temperature-sensitive substrates", in Solar Optical Materials XVI, Carl M. Lampert, Gaes-Goran Granqvist, Editors, Proceedings of SPIE vol. 3789, 29-37 (1999).

* cited by examiner

*Primary Examiner*—David Vu
(74) *Attorney, Agent, or Firm*—Scully, Scott, Murphy & Presser, P.C.; Louis J. Percello, Esq.

(57) ABSTRACT

A stress liner for use within a semiconductor structure that includes a field effect device has a dielectric constant less than about 7 and a compressive stress greater than about 5 GPa. The stress liner may be formed of a carbon based material, preferably a tetrahedral amorphous carbon (ta-C) material including at least about 60 atomic percent carbon and no greater than C about 40 atomic percent hydrogen. The carbon based material may be either a dielectric material, or given appropriate additional dielectric isolation structures, a semiconductor material. In particular, a ta-C stress liner may be formed using a filtered cathodic vacuum arc (FCVA) physical vapor deposition (PVD) method.

10 Claims, 4 Drawing Sheets

US 7,851,288 B2

FIELD EFFECT TRANSISTOR USING CARBON BASED STRESS LINER

BACKGROUND

1. Field of the Invention

The invention relates generally to channel stress within field effect devices. More particularly, the invention relates to stress liners that influence channel stress within field effect devices.

2. Description of the Related Art

Historically, most performance improvements in semiconductor field effect transistor (FET) devices have been realized by a downward scaling of the relative dimensions of the devices. This trend is becoming increasingly more difficult to continue as the devices reach their physical scaling limits. As a consequence, advanced FETs and the complementary metal oxide semiconductor (CMOS) circuits in which they may be used, are increasingly utilizing strain engineering to achieve desired circuit performance.

Strain engineering relies on the observation that carrier mobility within a semiconductor channel of a field effect device may be increased by inducing a mechanical strain within the semiconductor channel of the field effect device. A predicted mobility enhancement will typically depend upon carrier type (i.e., a hole or an electron) and the magnitude and direction of an applied stress (i.e., one that induces a strain) in relation to a semiconductor channel crystal orientation and direction of current flow. In a (100) silicon semiconductor substrate channel, electron mobility is typically increased by a tensile strain in the current flow direction, so tensile strain should provide an improved n-channel FET (i.e., nFET) performance. Conversely, hole mobility is typically increased by a compressive strain in a current flow direction, so compressive strain should provide an improved p-channel FET (i.e., pFET) performance.

A stress liner, which is typically deposited as a blanket layer over an FET device after a source/drain silicide formation processing step when fabricating the FET device, is included among the most useful and cost effective structures for inducing a semiconductor channel strain within the FET device.

FIG. 1 shows a plurality of generic FETs 10 and 10' that incorporate a corresponding plurality of stress liners 90 and 90'. The plurality of FETs 10 and 10' comprises a plurality of well regions 20 and 20' located over a substrate 9. The plurality of well regions 20 and 20' further comprises corresponding source/drain regions 30 and 30' that in turn are separated by corresponding semiconductor channel regions 40 and 40' located aligned beneath a plurality of corresponding gate dielectrics 50 and 50' having a corresponding plurality of gate electrodes 60 and 60' located thereon.

Optionally, the plurality of FETs 10 and 10' is separated by a plurality of isolation regions 70 that typically comprise a dielectric isolation material. Each of the individual gate electrodes 60 and 60' typically has a corresponding dielectric sidewall spacer 80 or 80' disposed thereupon. The dielectric sidewall spacers 80 or 80' typically comprise an inner spacer comprising an oxide material and an outer spacer comprising a nitride material, absent stress. The plurality of stress liners 90 and 90' typically comprise an appropriate tensile silicon nitride material or compressive silicon nitride material that covers the plurality of source/drain regions 30 and 30', the plurality of sidewall spacers 80 and 80', and the plurality of gate electrodes 60 and 60'.

For a given stress liner 90 or 90' and a corresponding FET 10 or 10' geometry, a semiconductor channel 40 or 40' strain will typically scale with the stress of the stress liner material. The stress liners 90 and 90' may comprise the same or different materials, and exhibit the same or different stresses. When FETs 10 and 10' are both FETs or both pFETs, the stress liners 90 and 90' would typically be formed from the same material; when the FETs 10 and 10' comprise one nFET and one pFET, stress liners 90 and 90' would typically be formed from a compressive stress material for the pFET and a tensile stress material for the nFET.

Silicon nitride is a particularly favored stress liner material for stress liners 90 and 90'. Silicon nitride stress liner materials typically exhibit excellent thermal stability and excellent dielectric properties, as well as desirable barrier properties, good adhesion, high modulus and ease of patterning. However, as gate pitch dimensions decrease, effectiveness of stress liners, including in particular silicon nitride stress liners, decreases. Thus, a need exists for more effective stress liners for use in CMOS structures having decreased dimensions, and in particular decreased gate pitch dimensions.

Various aspects of stress liners are disclosed in the semiconductor fabrication art.

For example, Cheng et al., in U.S. Pub. No. 2005/0186722 teaches a method for selectively relieving stress within a silicon nitride stress liner. The method uses a selective ion implantation of carbon or oxygen into a portion of the silicon nitride stress liner whose stress is desired to be modified and relieved.

In addition, Bryant et al., in U.S. Pub. No. 2005/0285187 teaches separate stress liners for an nFET device and a pFET device within a CMOS structure Finally, Thompson et al., in "Future of Strained Si/Semiconductors in Nanoscale MOSFETS," IEDM 2006, Paper 27.1, teaches in general maximum mobility enhancements that may be achieved for strained silicon substrates Since channel stress is likely to continue to be of considerable importance as semiconductor technology, including in particular CMOS technology, advances, desirable are additional semiconductor structures, including in particular CMOS structures, that beneficially incorporate novel stress liners that provide enhanced performance.

SUMMARY

The invention provides a semiconductor structure and a method for fabricating the semiconductor structure. The semiconductor structure includes a field effect device, and a stress liner located and formed over (and typically upon) the field effect device. The stress liner may comprise: (1) a dielectric material, such as a carbon based dielectric material, that has a dielectric constant less than about 7, and typically in a range from about 2.5 to about 3.5; and/or (2) at least one of a dielectric material and a semiconductor material, such as a carbon based dielectric material and/or a carbon based semiconductor material, that has a compressive stress greater than about 5 GPa, and typically in a range from about 5 to about 12 GPa.

The foregoing dielectric constant limits for the dielectric stress liner material are lower than conventional silicon nitride based stress liner materials which have a dielectric constant about 7. Such generally lower dielectric constant dielectric materials are desirable since such generally lower dielectric constant dielectric materials provide reduced gate to source/drain region (including contact via) capacitance within FETs within CMOS structures. The foregoing stress limits for the dielectric or semiconductor stress liner are generally higher than conventional silicon nitride based stress liner materials which typically have compressive stresses in the range from about 1 to about 3 GPa and tensile stresses in the range from about 1 to about 2 GPa. Such generally higher stress is desirable since, as noted above, stress within a semiconductor channel within an FET device within a CMOS structure generally scales with the stress of the stress liner material.

A particular carbon based dielectric material that fulfills the foregoing dielectric constant conditions and stress conditions comprises a tetrahedral amorphous carbon (ta-C) dielectric material that includes at least about 60 atomic percent carbon and less than about 40 atomic percent hydrogen. The ta-C dielectric material may also comprise up to about 5 atomic percent additional impurities and/or additives selected from the group including but not limited to boron (B), chlorine (Cl), fluorine (F), germanium (Ge), nitrogen (N), oxygen (O), phosphorus (P), silicon (Si), and additional metallic elements. In accordance with the embodiments that follow, such a ta-C based dielectric material may be deposited using a filtered cathodic vacuum arc (FCVA) physical vapor deposition (PVD) method.

More particularly, the invention contemplates the use of the ta-C material as a stress liner material that covers at least one (and preferably both) of a gate and a source/drain region of at least one FET. In particular, the use of the ta-C material provides the comparatively high compressive stresses that are retained within a stress liner even after annealing at a temperature from about 400 to about 450 degrees centigrade in an inert ambient for 4 hours.

In a first embodiment, a ta-C stress liner in accordance with the invention is selected to comprise a dielectric ta-C material that may be utilized in an FET structure that includes all, some, or none of a conventional quantity of sidewall spacers in place. The dielectric ta-C stress liner may further include at least one of an overlayer and an underlayer. In addition, semiconductor structures including more than one FET may have the dielectric ta-C stress liner located and formed upon one or more, including all, of the FETs.

In a second embodiment, a ta-C stress liner in accordance with the invention is selected to comprise a semiconductor ta-C material. Such a semiconductor ta-C material is encapsulated in insulating underlayers and overlayers and isolated electrically from a conductor via contacting a gate and/or a source/drain region within an FET by additional appropriate dielectric layers and dielectric structures.

A particular semiconductor structure in accordance with the invention includes a field effect device including a gate electrode located over a channel region within a semiconductor substrate that separates a pair of source/drain regions within the semiconductor substrate. This particular semiconductor structure also includes a stress liner located over the field effect device. The stress liner includes a carbon based material.

Another particular semiconductor structure in accordance with the invention also includes a field effect device including a gate electrode located over a channel region within a semiconductor substrate that separates a pair of source/drain regions within the semiconductor substrate. This other particular semiconductor structure also includes a stress liner located over the field effect device. The stress liner includes at least one of a dielectric material and a semiconductor material having a stress greater than about 5 GPa.

Yet another particular semiconductor structure in accordance with the invention also includes a field effect device including a gate electrode located over a channel region within a semiconductor substrate that separates a pair of source/drain regions within the semiconductor substrate. This other particular semiconductor structure also includes a stress liner located over the field effect device. The stress liner has a dielectric constant less than about 7.

A particular method for fabricating a semiconductor structure in accordance with the invention includes forming within and upon a semiconductor substrate a field effect device including a gate electrode formed over a channel region within the semiconductor substrate that separates a pair of source/drain regions formed within the semiconductor substrate. This particular method also includes forming a carbon based stress liner over the field effect device.

BRIEF DESCRIPTION OF THE DRAWINGS

The objects, features and advantages of the present invention will become apparent upon a consideration of the following detailed description of the invention, when read in conjunction with the drawings, in which.

DESCRIPTION OF THE PREFERRED EMBODIMENTS

The invention, which includes a semiconductor structure that includes a field effect device that includes a stress liner comprising a stress liner material that has particular dielectric constant and stress properties that may be realized within the context of a particular stress liner material, is understood within the context of the description set forth below. The description set forth below is understood within the context of the drawings described above. Since the drawings are intended for illustrative purposes, the drawings are not necessarily drawn to scale.

Figure 1:
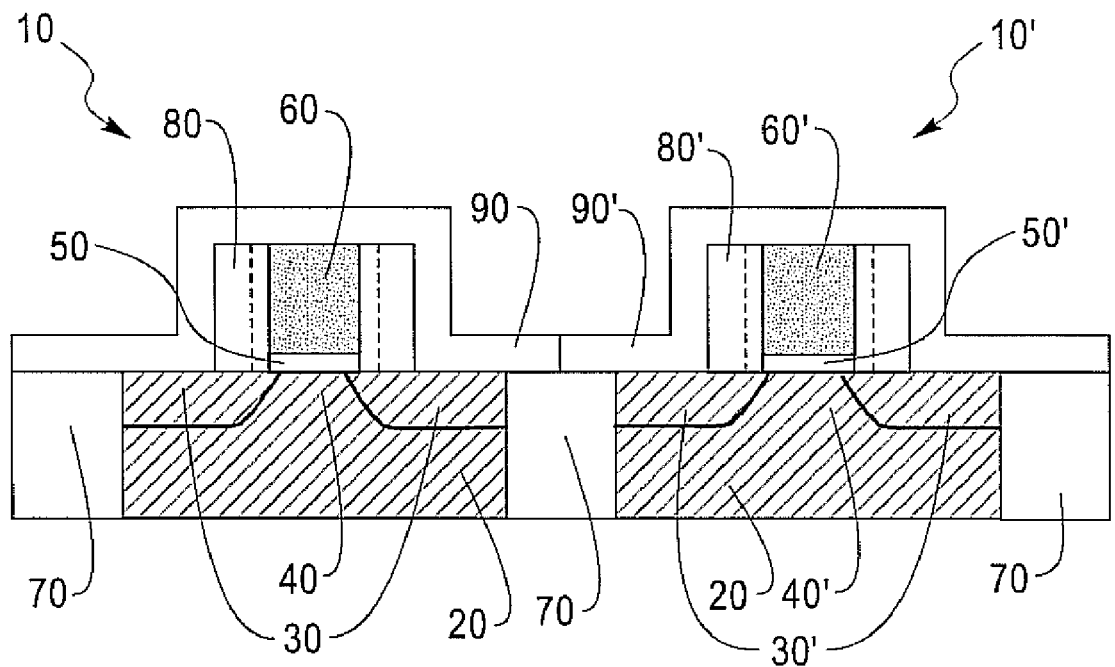
FIG. 1 shows a schematic cross-sectional diagram of a prior art CMOS structure including conventional tensile and compressive stress liners.
Figure 2:
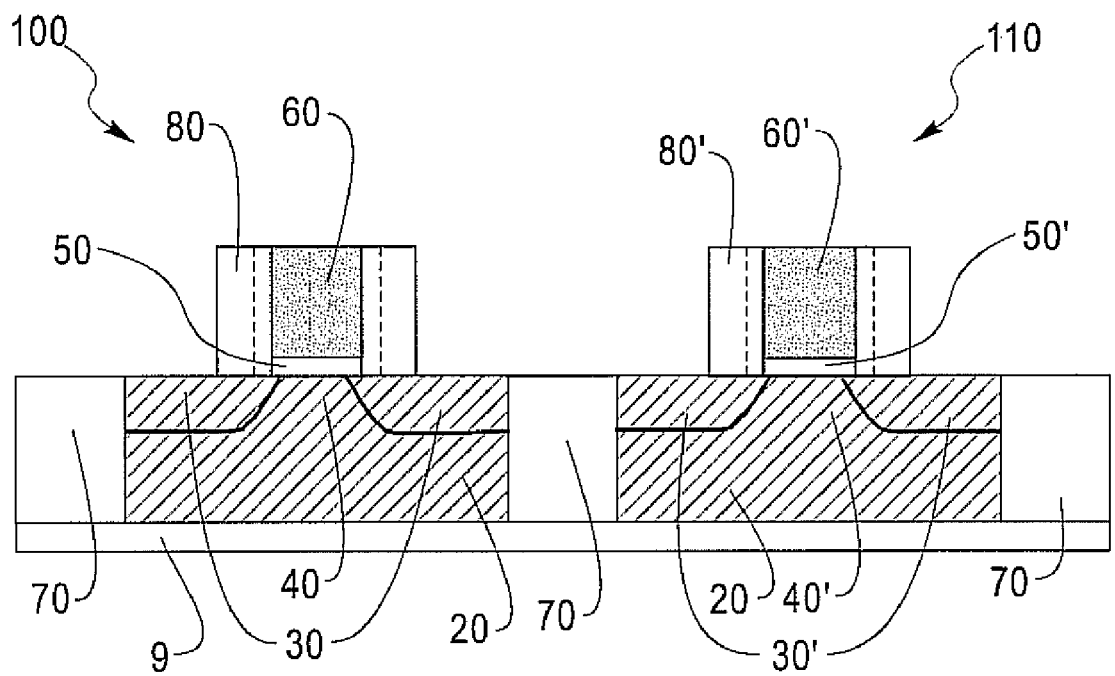
FIG. 2 to FIG. 4 show a series of schematic cross-sectional diagrams illustrating the results of progressive stages in fabricating a CMOS structure in accordance with a first embodiment of the invention.
Figure 3:
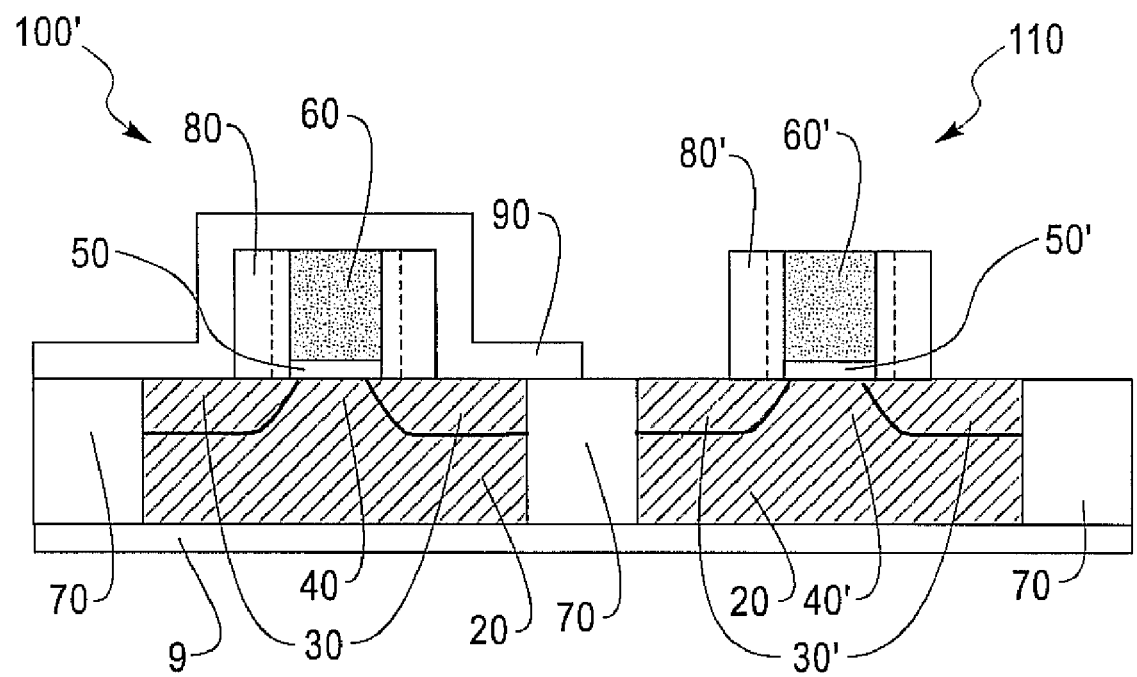
Figure 4:
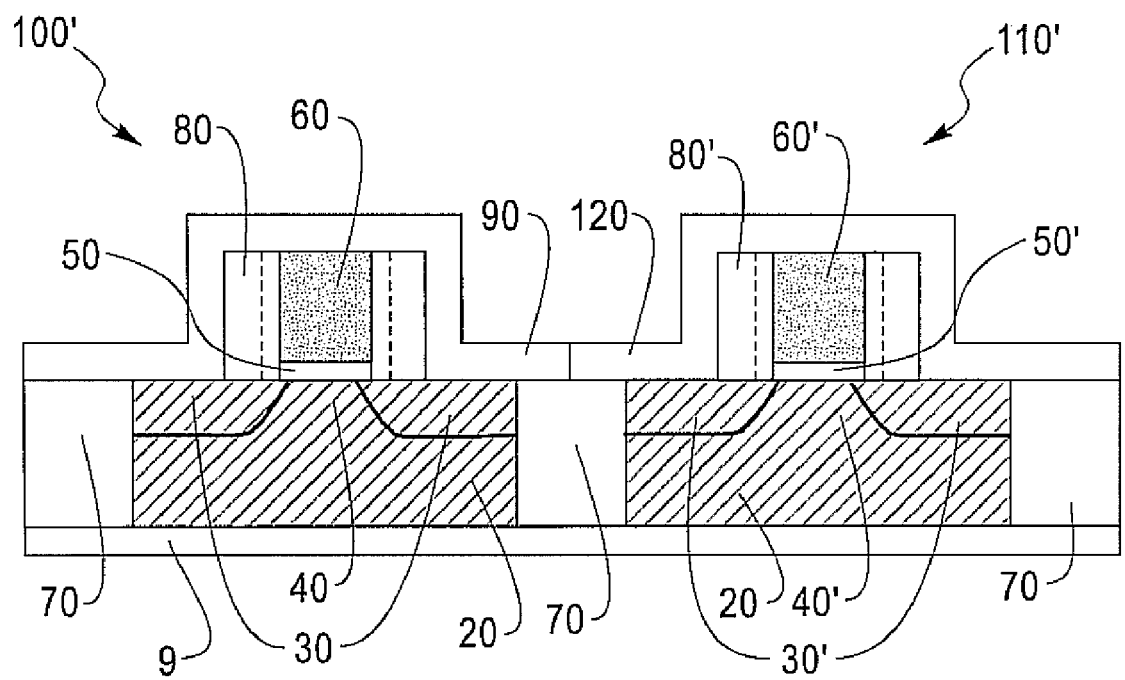

FIG. 2 to FIG. 4 show a series of schematic cross-sectional diagrams illustrating the results of progressive stages in fabricating a CMOS structure in accordance with an embodiment of the invention. This particular embodiment of the invention comprises a first embodiment of the invention. FIG. 2 shows a schematic cross-sectional diagram of the CMOS structure at an early stage in the fabrication thereof in accordance with this first embodiment.

FIG. 2 shows a substrate 9. A plurality of well regions 20 and 20' is located over the substrate 9 and separated by a plurality of isolation regions 70 also located over the substrate 9. Within the context of the instant embodiment (which does not limit the invention) with respect to the claimed invention, the well regions 20 and 20' and the substrate 9 in an aggregate are intended as a "semiconductor substrate."

The substrate 9 may in general comprise a dielectric material or a semiconductor material. Alternatively, the substrate 9 may comprise a dielectric material disposed upon a semiconductor material. Other materials of composition of the substrate 9 are not excluded. When comprising a semiconductor material, the substrate 9 may comprise any of several semiconductor materials. Non-limiting examples include silicon, germanium, silicon-germanium alloy, silicon carbon alloy, silicon-germanium carbon alloy and compound (i.e., III-V and II-VI) semiconductor materials. Non-limiting examples of compound semiconductor materials include gallium arsenide, indium arsenide and indium phosphide semiconductor materials. Typically, the substrate 9 has a thickness from about 250 to about 1000 micrometers.

Although not specifically illustrated in FIG. 2, the embodiment may be practiced using substrates (which need not necessarily correspond exactly with the substrate 9) including but not limited to bulk semiconductor substrates, semiconductor-on-insulator substrates and hybrid orientation substrates (i.e., having multiple crystallographic orientations within a single substrate). Semiconductor-on-insulator substrates and hybrid orientation substrates may be formed using any of several methods that are otherwise generally conventional in the semiconductor fabrication art. Included in particular are layer transfer methods, layer lamination methods, ion implantation oxidation methods and related buried layer oxidation methods. Within the context of the claimed invention, and within the context of appropriate fabrication, any of the foregoing substrates may be used as a "semiconductor substrate."

The well regions 20 and 20' are intended as complementary doped well regions with the well region 20 doped appropriately for fabricating an nFET and the well region 20' doped appropriately for fabricating a pFET The isolation regions 70 may comprise any of several dielectric isolation materials. Non-limiting examples include oxides, nitrides and oxynitrides, particularly of silicon, but oxides, nitrides and oxynitrides of other elements are not excluded. Typically, the isolation regions 70 primarily comprise an oxide of silicon.

FIG. 2 also shows (in cross-section) a plurality of field effect transistors 100 and 110 intended as an nFET and a pFET that are respectively located and formed within and upon the corresponding doped well regions 20 and 20' located over the substrate 9. The plurality of field effect transistors 100 and 110 comprises: (1) plurality of gate dielectrics 50 and 50' located upon the doped well regions 20 and 20' above a plurality of channel regions 40 and 40' located therein; (2) a plurality of gate electrodes 60 and 60' located upon the plurality of gate dielectrics 50 and 50'; (3) a plurality (in cross-section, but not in plan view) of optional spacer layers 80 and 80' located adjoining a pair of opposite sidewalls of the gate dielectrics 50 and 50', and the gate electrodes 60 and 60'; and (5) a plurality of source/drain regions 30 and 30' located within the doped well regions 20 and 20'. Each pair of source/drain regions 30 or 30' within the plurality of source/drain regions 30 and 30' is separated by the corresponding channel region 40 or 40' that is aligned beneath the corresponding gate electrode 60 or 60'. Each of the foregoing layers and structures that comprise the nFET 100 and the pFET 110 may comprise materials and have dimensions that are conventional in the semiconductor fabrication art. Each of the foregoing layers and structures that comprise the nFET 100 and the pFET 110 may also be formed using methods that are conventional in the semiconductor fabrication art.

The gate dielectrics 50 and 50' may individually comprise separate conventional dielectric materials such as oxides, nitrides and oxynitrides of silicon that have a dielectric constant from about 4 to about 20, measured in vacuum. Alternatively, one or both of the gate dielectrics 50 and 50' may comprise a generally higher dielectric constant dielectric material having a dielectric constant from about 20 to at least about 100. Such higher dielectric constant dielectric materials may include, but are not limited to, hafnium oxides, hafnium silicates, titanium oxides, barium-strontium-titantates (BSTs) and lead-zirconate-titanates (PZTs). The gate dielectrics 50 and 50' may be formed using any of several methods that are appropriate to their material(s) of composition. Included, but not limiting, are thermal or plasma oxidation or nitridation methods, chemical vapor deposition methods and physical vapor deposition methods.

The gate electrodes 60 and 60' may comprise materials including, but not limited to certain metals, metal alloys, metal nitrides and metal silicides, as well as laminates thereof and composites thereof The gate electrodes 60 and 60' may also comprise doped polysilicon and/or polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrodes 60 and 60' comprise a doped polysilicon material that has a thickness from about 600 to about 2000 angstroms.

The optional spacer layers 80 and 80' may comprise materials including, but not limited to, conductive materials and dielectric materials. Conductive spacer materials are less common, but are nonetheless known. Dielectric spacer materials are more common. The spacer materials may be formed using methods that are generally conventional in the semiconductor fabrication art. Included in general are methods that are analogous, equivalent, or identical to the methods that are used for forming the isolation regions 70. The spacer layers 80 and 80' are often formed by using a blanket layer deposition and anisotropic etchback method. Typically, the spacers 80 and 80' comprise an inner layer that comprises at least predominantly a silicon oxide material having a thickness from about 10 to about 100 angstroms having disposed thereupon an outer layer comprising at least predominantly a silicon nitride material having a thickness from about 100 to about 1000 angstroms. Neither the embodiment nor the invention is, however, so limited.

Finally, the plurality of source/drain regions 30 and 30' comprises a generally conventional dopant of appropriate conductivity type for fabricating the nFET 100 or the pFET 110. As is understood by a person skilled in the art, the plurality of source/drain regions 30 and 30' is formed using ion implantation. Resulting dopant concentrations are typically from about 1e19 to about 1e21 dopant atoms per cubic centimeter within each of the plurality of source/drain regions 30 and 30'.

FIG. 3 shows a stress liner 90 located and formed upon the nFET 100 that is illustrated in FIG. 2 to provide an nFET 100'. Within the instant embodiment, the stress liner 90 comprises a generally conventional stress liner material. Such generally conventional stress liner materials within the context of the instant embodiment, and of the invention, generally comprise a silicon containing dielectric material, such as but not limited to a silicon oxide material, a silicon nitride material or a silicon oxynitride material. Silicon nitride materials are particularly common.

FIG. 4 shows a stress liner 120 located and formed upon the pFET 110 that is illustrated in FIG. 3 to form therefrom a pFET 110'. The stress liner 120 comprises as a non-limiting composition a carbon based material, and in particular as a further non-limiting composition a tetrahedral amorphous carbon (ta-C) material, that is generally desirable within the instant embodiment insofar as the stress liner 120 provides:

(1) a generally low dielectric constant (i.e., considerably less than the value of greater than about 7 that is common for silicon nitride based stress liners (for example, less than about 7, and further less than about 5), and also less than the value of about 4 that is common for silicon oxide materials, and preferably from about 2.5 to about 3.5 and more preferably from about 2.5 to about 3.0); and/or (2) a generally high stress (i.e., greater than about 1 GPa to about 4 GPa compressive (for example about 5 GPa) that is common for silicon nitride materials and also greater than about 8 GPa, and preferably from about 5 to about 12 GPa and more preferably from about 9 to about 12 GPa) so that a particularly high strain may be realized within the channel 40' while providing a reduced parasitic capacitance within the pFET 110'.

Low dielectric constant dielectric materials have long been of interest within the context of applications such as intralevel dielectric layers and interlevel dielectric layers in multilevel interconnect structures that may be proximate to an FET structure. General characteristics of such materials are taught within Gates et al., in U.S. Pat. No. 7,030,468. Such low dielectric constant materials have, for the most part, included low stress (<50 MPa) materials due to concerns about structural integrity and mechanical reliability.

Hydrogenated amorphous carbon (a-C:H, which is also known as diamond-like carbon (DLC)) and non-hydrogenated amorphous carbon (a-C), and in particular tetrahedrally bonded a-C (ta-C), have, on the other hand, long been of interest for applications such as hard coatings and/or wear-resistant coatings. Thin films formed of ta-C may be deposited by a variety of techniques including plasma-assisted chemical vapor deposition (PACVD) and filtered cathodic vacuum arc (FCVA) physical vapor deposition (PVD) methods. Thin films formed of ta-C typically have properties that may be tuned by varying the deposition conditions. Particular disclosures relating to a-CH, a-C and ta-C thin films include: (1) Fallon et al., in "Properties of filtered-ion-beam-deposited diamond-like carbon as a function of ion energy," Phys. Rev. B, 48, 4777 (1993); (2) Ha et al., in "Intrinsic stress of DLC film prepared by RF plasma CVD and filtered cathodic arc PVD," IEEE International Conference on Plasma Science, Paper 6D7, June 2005, Monterey, Calif.; and (3) Grill, in "Plasma-deposited diamond-like carbon and related materials," IBM J. Res. Devel., 43, 147 (1999). Further details regarding filtered cathodic vacuum arc (FCVA) physical vapor deposition (PVD) methods are found within Fulton, in "New Ion Assisted Filtered Cathodic Arc Deposition (IF-CAD) technology for producing advanced thin-films on temperature sensitive substrates," Solar Optic Materials, XVI, Proc. SPIE, Vol. 3789, 29-37 (1999). Typically the foregoing ta-C thin films have very high intrinsic compressive stresses in a range from about 1 to about 12 GPa. In addition, deposition-condition-induced variations of atomic arrangements of carbon and hydrogen may provide variations in conductivity of ta-C thin films. Thus, these ta-C thin films may have a resistivities ranging from semiconducting to insulating (i.e., $10^2$ to $10^{16}$ ohm-cm).

Of the deposition techniques for ta-C mentioned above, FCVA is the most preferred. As described by Fallon et al., a graphite target is irradiated with a high current/low voltage cathodic arc (essentially a high power electron beam), resulting in the ejection of a shower of neutral and ionized carbon particles ranging in size from single atoms to large clusters. The ions are separated from the neutrals, and a beam of $C^+$ ions is filtered out from the other ions. The $C^+$ ions, typically in a vacuum of $10^{-5}$ to $10^{-8}$ Torr, are directed towards a substrate and impinge on said substrate with an energy that may be tuned from about 20 eV to about 1000 eV, depending on the film properties desired. Substrate cooling is typically used to keep the substrate temperature below 75° C.

As described above within the context of the foregoing process parameters, the ta-C stress liner 120 may be deposited having a desirably low dielectric constant and a desirably high stress within the ranges disclosed above.

Although not particularly illustrated in FIG. 4, the ta-C stress liner 120, even when comprised of a dielectric ta-C material, may further include at least one of an overlayer and an underlayer that comprises a different dielectric material.

Figure 5:
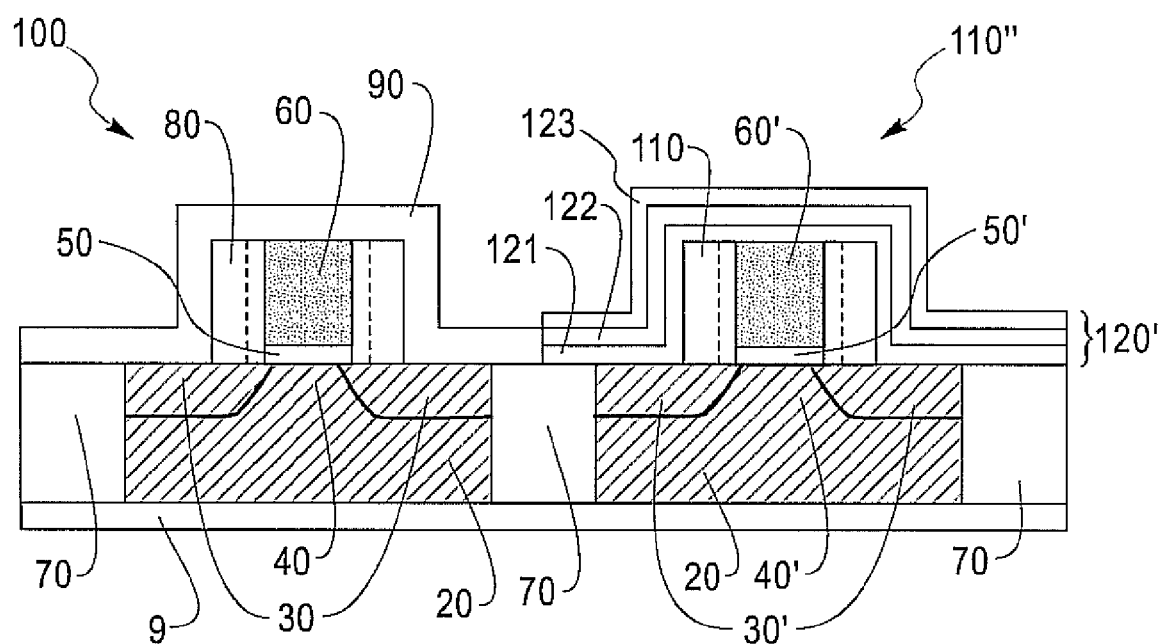
FIG. 5 shows a schematic cross-sectional diagram illustrating a CMOS structure in accordance with a second embodiment of the invention.

FIG. 5 more particularly illustrates as an additional embodiment a pFET 110'' that alternatively results from further processing of the pFET 110 that is illustrated in FIG. 3. The pFET 110'' comprises a ta-C containing stress liner 120' that comprises a dielectric underlayer 121 located and formed upon the pFET 110'' that is illustrated in FIG. 4, a ta-C stress liner 122 located upon the dielectric underlayer 121, and a dielectric overlayer 123 located and formed upon the ta-C stress liner 122. The dielectric underlayer 121 may be used to improve and/or supplement, for example, the ta-C stress liner 122 adhesion, The dielectric underlayer may alternatively provide diffusion barrier properties, and/or provide for ease of patterning. A comparatively thin dielectric underlayer 121 might also be useful in reducing substrate damage from energetic particle bombardment during the ta-C stress liner 122 deposition process. The dielectric overlayer 123 or the dielectric underlayer 121 material may be selected, for example and without limitation, from the group consisting of a silicon oxide, a silicon nitride, a silicon oxynitride and any combination thereof, wherein the dielectric overlayer 123 or the dielectric underlayer 121 may be formed from the same of different materials, and may or may not possess an intrinsic, preferably compressive, stress. Alternative dielectric materials are not excluded.

The thickness of stress liners 120 and 120' within the foregoing embodiments typically ranges from about 10 nm to about 200 nm, and more preferably from about 30 nm to about 60 nm. The dielectric underlayer 121 and the dielectric overlayer 123, if present, might be thinner, typically in a range from about 2 nm to about 50 nm, more preferably in a range from about 2 nm to about 20 nm.

Use of the ta-C stress liner (or an alternate material having appropriate physical properties) within the embodiments is also contemplated with the context of: (1) other planar FET geometries including but not limited to those with differently shaped spacers and raised source/drain regions; as well as (2) non-planar FET geometries (i.e., including but not limited to finFET and tri-gate geometries). In addition, semiconductor structures comprising more than one FET may include a ta-C containing stress liner on one or more, including all, of the FETs. As is illustrated within the context of the foregoing embodiments, a ta-C stress liner when used within the context of a CMOS structure is typically located and formed upon a pFET therein.

Finally, while the embodiments as illustrated in FIG. 2 to FIG. 5 illustrate the invention within the context of forming the stress liner 90 prior to the stress liner 120 or 120', a reverse ordering of fabrication of those stress liners is also within the context of the embodiments and the invention.

Figure 6:
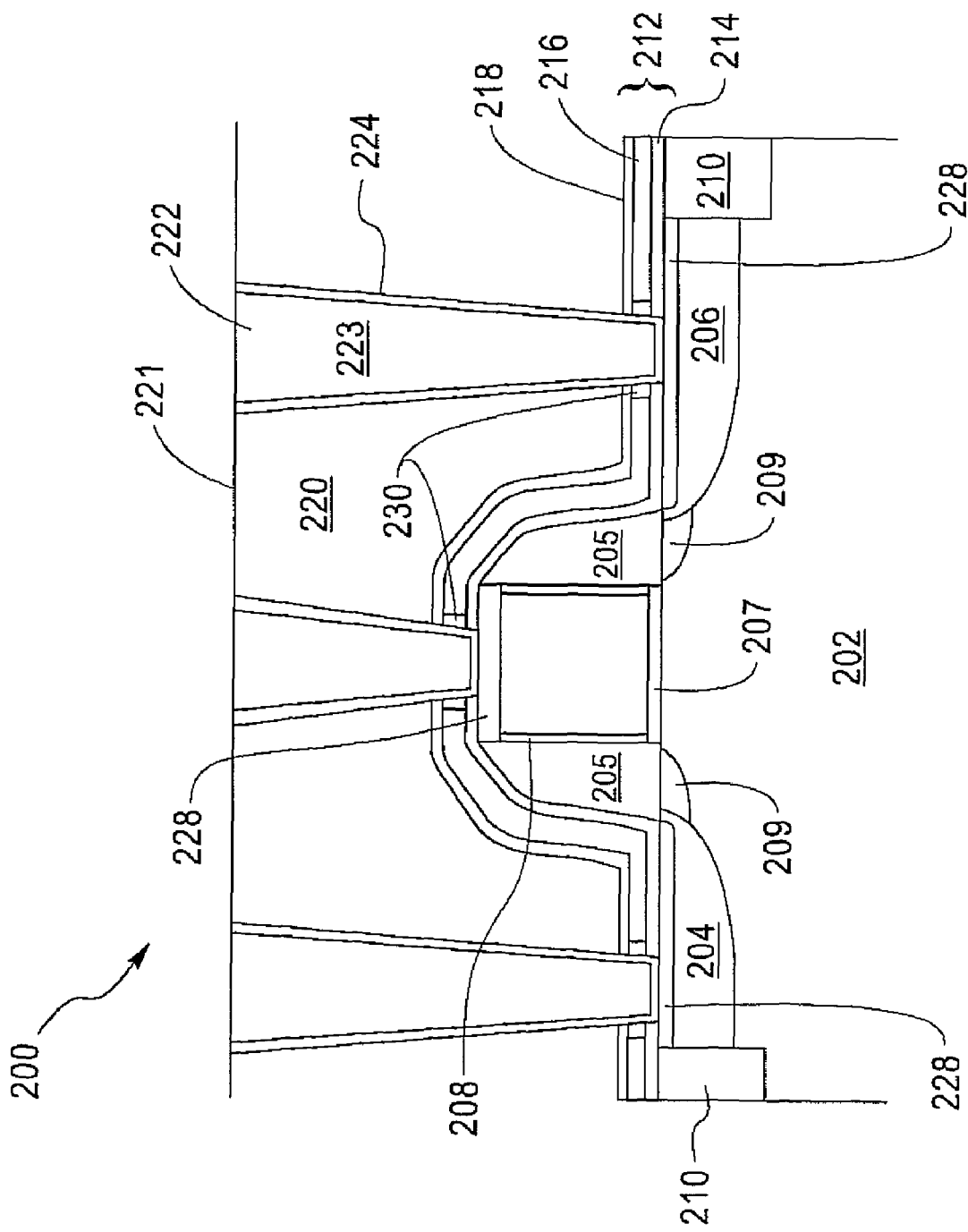
FIG. 6 shows a schematic cross-sectional diagram generally illustrating the results of further processing of part of a CMOS structure generally in accordance with the CMOS structure whose schematic cross-sectional diagram is illustrated in FIG. 5.

FIG. 6 shows the results of further processing of a semiconductor structure generally in accordance with the pFET portion of the semiconductor structure whose schematic cross-sectional diagram is illustrated in FIG. 5.

FIG. 6 shows an FET 200 that comprises a semiconductor substrate 202 that includes a plurality of source/drain regions 204, 206. The source/drain regions 204, 206 are interchangeable and are typically formed by ion implantation. A gate electrode 208 is located and formed on a gate dielectric 207, disposed on an area of the semiconductor substrate 202 located between the source/drain regions 204, 206. The gate dielectric 207 may be formed from materials, for example, but not limited to: silicon dioxide ($SiO_2$), silicon oxynitride (SiON), and metal-containing oxides, oxynitrides, and silicates such as $HfO_2$ and HFON, ad $Hf(Si)O_2$. Each of the source/drain regions 204, 206 may include an extension region 209. Between each adjacent source/drain region 204, 206, a trench isolation region 210 maybe provided. A silicide layer 228 is disposed on each of the gate 208, and the source/drain regions 204, 206. The silicide layer 228 may be formed using any known or later developed techniques, for example, depositing a metal such as titanium, nickel or cobalt; annealing the metal with the silicon material which it contacts and removing unreacted metal.

A stress liner 212 is disposed over the gate 208 and the source/drain regions 204, 206. The stress liner 212 preferably includes a semiconductor ta-C stress liner 216 disposed between a first insulating layer 214 and a second insulating layer 218. The first and second insulating layers 214, 218 may be formed from, for example, silicon oxide ($SiO_2$), silicon oxynitride, silicon nitride ($Si_3N_4$) and any combination thereof. The stress liner 212 has a thickness ranging from about 50 nm to about 100 nm. The stressed semiconductor ta-C layer 216 has a thickness ranging from about 20 nm to about 80 nm. The first and second insulating layers 214, 218 each have a thickness ranging from about 5 nm to about 10 nm. The stress liner 212 would typically be intrinsically compressively stressed. The first and second insulating layers 214, 218 of silicon nitride, silicon oxide or silicon oxynitride, or any combination thereof, may be stressed or unstressed, but would typically be compressively stressed so that an induced channel stresses would add to those provided by the semiconductor ta-C stress liner 216. A third insulating layer 220 is located and deposited on the stress liner 212. A plurality of conductive vias 222 extend from an exposed surface 221 through insulating layer 220 and terminate at the silicide layers 228 above the gate 208, and the source/drain regions 204, 206. Each conductive via 222 includes a conductive material 223 and a conductive metal diffusion barrier liner 224. The conductive vias 222 extend through a plurality of insulating seals 230 which electrically isolate the conductive vias 222 from the semiconductor stress liner 216. The insulating seals 230 may be restricted to regions above the first insulating layer 214 and below the second insulating layer 218, or they may be expanded to take the form of a dielectric liner layer contacting an entire sidewall region of a conductive via 222.

FIG. 4, FIG. 5 and FIG. 6 show a series of schematic cross-sectional diagrams illustrating semiconductor structures in accordance with preferred embodiments of the invention. Each of the semiconductor structures illustrates a stress liner 120, 120' or 212 which may comprise a dielectric material or a semiconductor material, within a FET structure and in particular within a pFET structure within a CMOS structure. Within the embodiments, the stress liner has a dielectric constant less than about 7 and also less than about 4. Typically, the stress liner has a dielectric constant from about 2.5 to about 3.5 and more preferably from about 2.5 to about 3.0. The stress liner also has a stress greater than about 5 GPa and more preferably greater than about 8 GPa. Typically, the stress liner has a stress from about 5 to about 12 and more preferably from about 9 to about 12. A stress liner in accordance with the embodiments may comprise a ta-C carbon material comprising at least about 60 atomic percent carbon and no greater than about 40 atomic percent hydrogen. Such a ta-C material may be deposited using a filtered cathodic vacuum arc (FCVA) physical vapor deposition (PVD) method.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method for forming a semiconductor structure comprising:
   forming within and upon a semiconductor substrate a field effect device including a gate electrode formed over a channel region within the semiconductor substrate that separates a pair of source/drain regions formed within the semiconductor substrate; and
   forming a carbon based stress inducing liner over the field effect device, wherein the carbon based stress inducing liner is comprised of hydrogenated tetrahedral amorphous carbon (ta-C) and induces a strain greater than 5 GPa on the field effect device.

2. The method of claim 1, wherein the forming the carbon based stress inducing liner comprises
   at least about 60 atomic percent carbon;
   up to about 40 atomic percent hydrogen; and
   up to about 5 atomic percent additional materials selected from the group consisting of boron, chlorine, fluorine, germanium, nitrogen, oxygen, phosphorus, silicon and metallic elements.

3. The method of claim 1 wherein the forming the carbon based stress inducing liner provides the carbon based stress inducing liner with a dielectric constant less than about 7.

4. The method of claim 1 wherein the forming the carbon based stress inducing liner uses a filtered cathodic vacuum arc (FCVA) physical vapor deposition (PVD) method.

5. The method of claim 1 wherein the forming the carbon based stress inducing liner comprises forming a semiconducting carbon based stress inducing liner.

6. The method of claim 5 further comprising:
   forming an aperture through the semiconducting carbon based stress inducing liner; and
   forming a dielectric structure passivating a sidewall of the semiconducting carbon based stress inducing liner within the aperture.

7. The method of claim 1 wherein the forming the carbon based stress inducing liner provides that the carbon based stress inducing liner is formed contacting the gate within the field effect device.

8. The method of claim 1 wherein the forming the carbon based stress inducing liner provides that the carbon based stress inducing liner is formed contacting a spacer within the field effect device.

9. The method of claim 1 wherein the forming the carbon based stress inducing liner provides that the carbon based stress inducing liner is formed contacting the pair of source/drain regions within the field effect device.

10. A method for forming a semiconductor structure comprising:
    forming within and upon a first portion of a semiconductor substrate an n-type field effect device including a first gate electrode formed over a first channel region within the semiconductor substrate that separates a pair of n-type source/drain regions formed within the semiconductor substrate;

forming within and upon a second portion of the semiconductor substrate a p-type field effect device including a second gate electrode formed over a second channel region within the semiconductor substrate that separates a pair of p-type source/drain regions formed within the semiconductor substrate;

forming a carbon based stress inducing liner over the p-type field effect device, wherein the carbon based stress inducing liner is comprised of tetrahedral amorphous carbon (ta-C) and induces a compressive strain greater than 5 GPa on the p-type field effect device; and forming a silicon nitride based stress including liner over the n-type field effect device, wherein the silicon nitride based stress incuding liner induces a tensile strain on the n-type field effect device.

* * * * *